United States Patent
Jin

(10) Patent No.: US 11,515,609 B2
(45) Date of Patent: Nov. 29, 2022

(54) TRANSMISSION LINE STRUCTURES FOR MILLIMETER WAVE SIGNALS

(71) Applicant: Taiwan Semiconductor Manufacturing Company, Ltd., Hsinchu (TW)

(72) Inventor: Jun-De Jin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/577,359

(22) Filed: Sep. 20, 2019

(65) Prior Publication Data
US 2020/0295426 A1 Sep. 17, 2020

Related U.S. Application Data

(60) Provisional application No. 62/818,672, filed on Mar. 14, 2019.

(51) Int. Cl.
*H01P 3/00* (2006.01)
*H01P 11/00* (2006.01)
*H01L 23/66* (2006.01)

(52) U.S. Cl.
CPC .......... *H01P 3/003* (2013.01); *H01L 23/66* (2013.01); *H01P 11/003* (2013.01); *H01L 2223/6627* (2013.01); *H01L 2223/6683* (2013.01)

(58) Field of Classification Search
CPC ........ H01P 3/003; H01P 11/003; H01L 23/66; H01L 2223/6683; H01L 2223/6627
See application file for complete search history.

(56) References Cited

U.S. PATENT DOCUMENTS

| | | | |
|---|---|---|---|
| 5,408,053 A * | 4/1995 | Young | H01P 3/088 174/262 |
| 6,686,810 B2 | 2/2004 | Mueller-Fiedler et al. | |
| 7,583,169 B1 | 9/2009 | Scardelletti | |
| 8,008,930 B2 | 8/2011 | Subramanyam | |
| 8,907,849 B2 | 12/2014 | Rogers et al. | |
| 9,293,699 B1 | 3/2016 | Moon | |

(Continued)

FOREIGN PATENT DOCUMENTS

| | | |
|---|---|---|
| CN | 104737372 A | 6/2015 |
| CN | 105548604 A | 5/2016 |

(Continued)

OTHER PUBLICATIONS

ECE 4880, Cornell University, Fall 2016 [online], retrieved on Feb. 7, 2022. Retrieved from Internet:<https://cpb-us-w2.wpmucdn.com/sites.coecis.cornell.edu/dist/4/81/files/2017/03/ece4880_handout1-2kuyyt0.pdf> (Year: 2016).*

(Continued)

*Primary Examiner* — Sitaramarao S Yechuri
(74) *Attorney, Agent, or Firm* — Merchant & Gould P.C.

(57) ABSTRACT

A coplanar waveguide structure includes a dielectric layer disposed over at least a portion of a substrate and a planar transmission line disposed within the dielectric layer. In some instances, the planar transmission line can include a conductive signal line and one or more ground lines. In other instances, the planar transmission line may include a conductive stacked signal line and one or more stacked ground lines.

20 Claims, 6 Drawing Sheets

(56) References Cited

U.S. PATENT DOCUMENTS

| | | | | |
|---|---|---|---|---|
| 2004/0041653 A1* | 3/2004 | Tanabe | ................... | H01P 3/003 333/34 |
| 2004/0251529 A1* | 12/2004 | Lee | ......................... | H01L 23/66 257/686 |
| 2005/0156691 A1* | 7/2005 | Takenaka | ................ | H01P 3/081 333/238 |
| 2008/0079170 A1* | 4/2008 | Pruvost | ................... | H01L 23/66 257/774 |
| 2009/0284331 A1 | 11/2009 | Pruvost et al. | | |
| 2010/0079222 A1* | 4/2010 | Makita | ................... | H01L 23/66 333/238 |
| 2010/0315181 A1* | 12/2010 | Mina | ....................... | H01P 3/085 333/238 |
| 2012/0186867 A1* | 7/2012 | Asai | ..................... | H05K 3/0038 174/262 |
| 2012/0308177 A1* | 12/2012 | Joblot | .................... | H01L 23/66 385/14 |
| 2014/0042612 A1* | 2/2014 | Liu | ..................... | H01L 23/5227 257/734 |
| 2016/0035672 A1* | 2/2016 | Funaya | ................... | H01L 22/14 257/531 |
| 2016/0099684 A1* | 4/2016 | Qiu | ..................... | H01L 27/0688 330/307 |
| 2016/0181154 A1* | 6/2016 | Stecher | ............ | H01L 21/76873 438/641 |

FOREIGN PATENT DOCUMENTS

| | | |
|---|---|---|
| EP | 1 557 901 A1 | 7/2005 |
| JP | 2008-534930 A | 8/2008 |
| KR | 2002-0035624 A | 5/2002 |

OTHER PUBLICATIONS

Hanna et al. "Theoretical and experimental Investigation of asymmetric coplanar waveguides", IEEE Transactions on Microwave Theory and Techniques, vol. MTT-32, No. 12, Dec. 1984 (Year: 1984).*

* cited by examiner

TRANSMISSION LINE STRUCTURES FOR MILLIMETER WAVE SIGNALS

CROSS-REFERENCE TO RELATED APPLICATION(S)

This application claims priority to U.S. Provisional Application No. 62/818,672 entitled "Transmission Line Structures For Millimeter Wave Signals," filed on Mar. 14, 2019, of which the entire disclosure is hereby incorporated by reference in its entirety.

BACKGROUND

Recent advances in wireless networks allow wireless communication devices to operate at higher signal frequencies. In some instances, a wireless network can use the millimeter wave frequencies for high-speed wireless communications. The Fifth Generation (5G) cellular communication network is an example wireless network that uses higher millimeter wave frequencies. For example, the 5G cellular network may operate between twenty-four to thirty gigahertz (24-30 GHz) and one hundred gigahertz (100 GHz).

One challenge associated with the use of higher millimeter wave frequencies relates to the design and fabrication of transmission line structures. Microstrip transmission line structures are one type of transmission lines that are used. For example, microstrip transmission line structures are commonly used in silicon-based integrated circuits. However, the silicon substrate can be lossy and the insertion loss for the microstrip transmission line structure can be unacceptably high.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
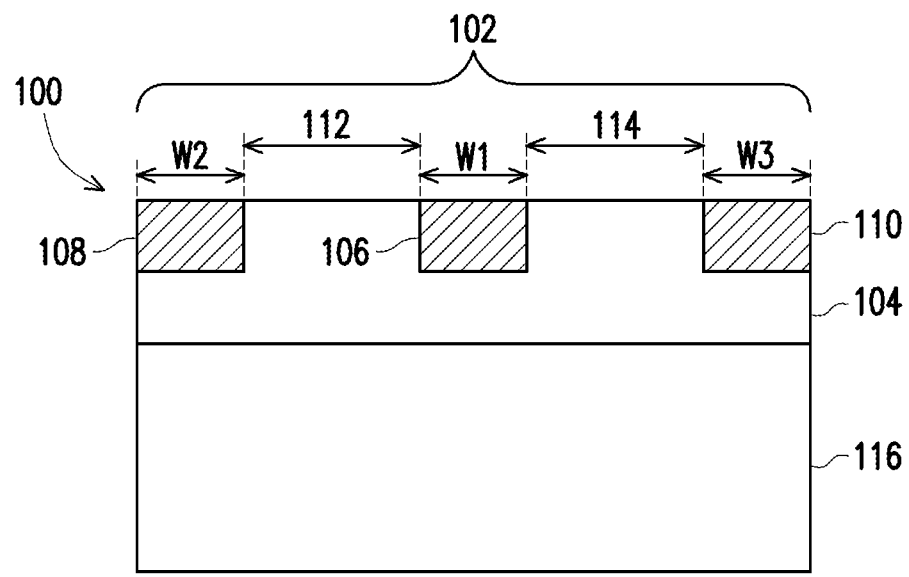
FIG. 1 illustrates a cross-sectional view of a first example of a coplanar waveguide structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein provide coplanar waveguide structures that can transmit and/or receive at least millimeter wave signals. The coplanar waveguide structures can be used in a variety of products, applications, and systems. For example, the coplanar waveguide structures may be used in security screening systems, medicine applications, weapons systems, network interface cards, telecommunication systems, and network systems, including cellular networks. The coplanar waveguide structures can be implemented in microwave integrated circuits (MICs), monolithic microwave integrated circuits (MMICs), and other integrated circuits or electronic components that transmit and/or receive at least millimeter wave signals. The integrated circuits that include one or more co-planar waveguide structures may be implemented in electronic devices such as cellular phones, computing devices, routers, switches, base transceiver stations, and base controller stations.

These and other embodiments are discussed below with reference to FIGS. 1-8. However, those skilled in the art will readily appreciate that the detailed description given herein with respect to these Figures is for explanatory purposes only and should not be construed as limiting.

FIG. 1 illustrates a cross-sectional view of a first example of a coplanar waveguide structure in accordance with some embodiments. The coplanar waveguide structure 100 includes a planar transmission line 102 disposed within a dielectric layer 104. The planar transmission line 102 includes a conductive signal line 106 and two ground lines 108, 110 positioned on either side of the conductive signal line 106. The conductive signal line 106 and the ground lines 108, 110 lie in the same plane. The conductive signal line 106 is separated from the ground line 108 by a first distance 112 and the conductive signal line 106 is separated from the ground line 110 by a second distance 114. The first and the second distances 112, 114 can be substantially equal or the first distance 112 may differ from the second distance 114. Although only one planar transmission line is shown, any number of planar transmission lines can be included in, or connected to, an integrated circuit or other electrical component.

In the illustrated embodiment, the conductive signal line 106 and the ground lines 108, 110 are formed in the top conductive layer of an integrated circuit, such as the top metal layer. In some instances, the top conductive layer is an ultra-thick metal (UTM) layer. In a non-limiting example, a UTM layer has a thickness of one to fifty micrometers, although other embodiments are not limited to this configuration. Example types of metals that can be used in the conductive signal line 106 and the ground lines 108, 110 include, but are not limited to, copper, silver, and aluminum.

The dielectric layer 104 is disposed over a high resistivity substrate 116. The high resistivity substrate 116 can reduce insertion loss, harmonic distortion, and/or the size of the transmission line and/or the integrated circuit. Additionally or alternatively, the high resistivity substrate 116 may improve reliability and/or performance of the transmission line. In one embodiment, the high resistivity substrate 116 is a high resistivity silicon substrate, although other embodiments are not limited to this type of high resistivity substrate. Other types of high resistivity substrates include, but are not limited to, high resistivity silicon-on-insulator substrates and high resistivity gallium arsenide substrates. In general, a substrate is a high resistivity substrate when a resistance of the substrate is substantially ten ohms or higher.

The width of the conductive signal line 106 is W1, the width of the ground line 108 is W2, and the width of the ground line 110 is W3. The widths W1, W2, and W3 can be the same width or at least one width can differ from another width. The widths W1, W2, W3 are based at least part on the structure of a microstrip transmission line. The widths W1, W2, W3 are determined based on characteristics such as which conductive layers form the conductive signal line 106 and the ground lines 108, 110, the number of conductive layers that form the conductive signal line 106 and the ground lines 108, 110, the conductive layer scheme for the microstrip transmission line structure 100, and/or the characteristic impedance of the microstrip transmission line structure 100.

Figure 2:
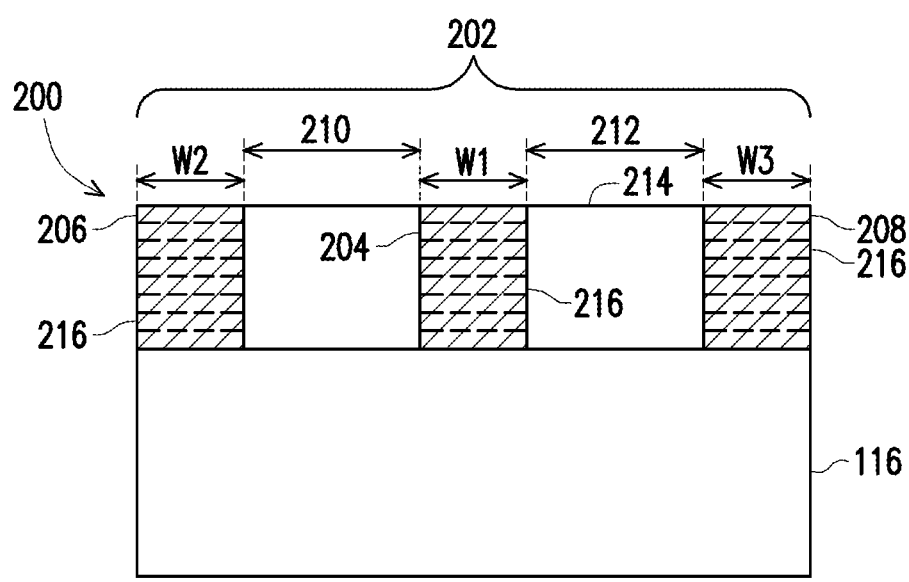
FIG. 2 depicts a cross-sectional view of a second example of a coplanar waveguide structure in accordance with some embodiments.

FIG. 2 depicts a cross-sectional view of a second example of a coplanar waveguide structure in accordance with some embodiments. The coplanar waveguide structure 200 includes a planar transmission line 202 disposed over a high resistivity substrate 116. The planar transmission line 202 includes a conductive stacked signal line 204 and two stacked ground lines 206, 208 positioned on either side of the conductive stacked signal line 204. The conductive stacked signal line 204 is separated from the stacked ground line 206 by a distance 210, and the conductive stacked signal line 204 is separated from the stacked ground line 208 by a distance 212. The distances 210, 212 can be the same distance or different distances. Although only one planar transmission line is shown, any number of planar transmission lines can be included in, or connected to, an integrated circuit or other electrical component.

The conductive stacked signal line 204 and the stacked ground lines 206, 208 are disposed within a dielectric layer 214. The conductive stacked signal line 204 and the stacked ground lines 206, 208 are formed by vertically stacking conductive segments 216 in multiple conductive layers and connecting the conductive segments with vias (shown in FIG. 4) to form the conductive stacked signal line 204 and the stacked ground lines 206, 208. Thus, the conductive segments 216 are interlaced with vias in via layers (shown in FIG. 4), and collectively the conductive segments and the vias form the conductive stacked signal line 204 and the stacked ground lines 206, 208. For example, the conductive stacked signal line 204 and the stacked ground lines 206, 208 are formed with conductive segments 216 in multiple conductive layers (e.g., $C_1$ through $C_N$) and vias in one or more via layers (e.g., $V_1$ through $V_M$, where N is a number greater than one, M is a number equal to or greater than one, and M is less than N). In some aspects, N is the top conductive layer, which can be a UTM layer.

In another implementation, N is a conductive layer below the top conductive layer (e.g., N–1). This can reduce the cost of the planar transmission line since fewer conductive segments are used to form the conductive stacked signal line and the stacked ground lines. When a conductive segment in the top conductive layer is not used in the conductive stacked signal line and the stacked ground lines, the cost savings can be greater when the top conductive layer is a UTM layer.

The width of the conductive stacked signal line 204 is W1, the width of the stacked ground line 206 is W2, and the width of the stacked ground line 208 is W3. The widths W1, W2, and W3 can be the same width or at least one width can differ from another width. Like the embodiment shown in FIG. 1, the widths W1, W2, W3 are based on the structure of a microstrip transmission line.

Since resistance is inversely proportional to width and thickness, the conductive stacked signal line 204 and the stacked ground lines 206, 208 can reduce the insertion loss of the planar transmission line 202 because the thickness of the conductive stacked signal line 204 and the stacked ground lines 206, 208 is greater. Additionally, increasing the widths of the conductive stacked signal line 204 and the stacked ground lines 206, 208 can reduce the insertion loss because the widths are greater. Additionally or alternatively, the planar transmission line 202 can produce a slow-wave effect when a signal is transmitted. The slow-wave effect can reduce attenuation loss.

Figure 3:
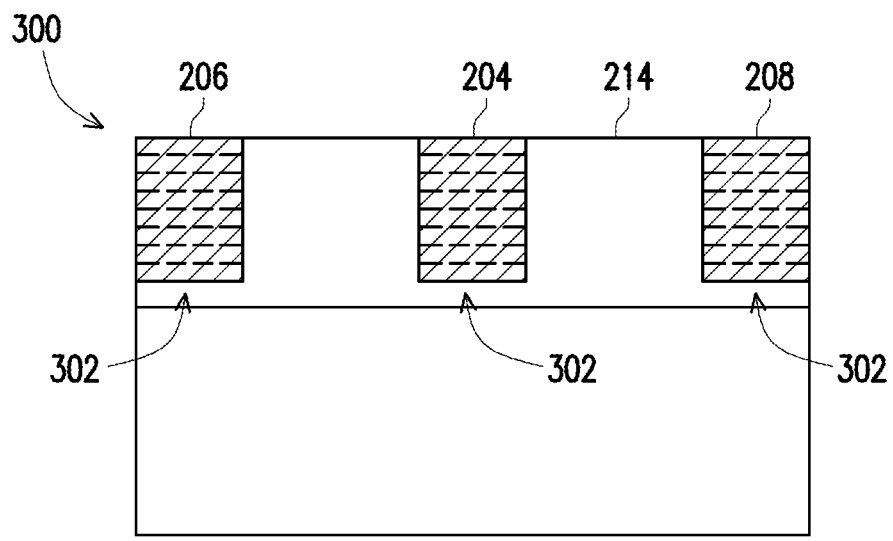
FIG. 3 illustrates a cross-sectional view of a third example of a coplanar waveguide structure in accordance with some embodiments.

FIG. 3 illustrates a cross-sectional view of a third example of a coplanar waveguide structure in accordance with some embodiments. The coplanar waveguide structure 300 is similar to the structure shown in FIG. 2 except that the conductive stacked signal line 204 and the stacked ground lines 206 208 are disposed over a portion 302 of the dielectric layer 214 as well as being disposed within the dielectric layer 214.

Figure 4:
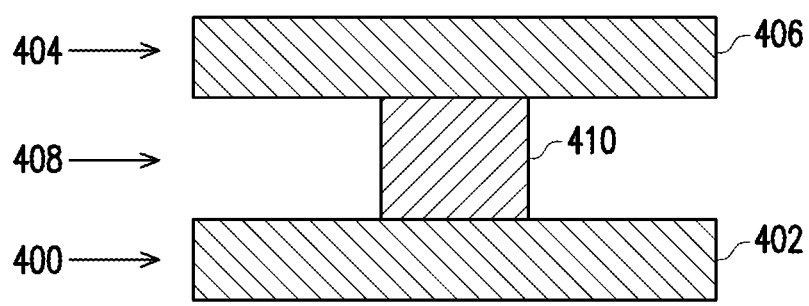
FIG. 4 depicts an example construct of a via and two conductive segments that can be used in the conductive stacked signal line and the stacked ground lines.

FIG. 4 depicts an example construct of a via and two conductive segments that can be used in the conductive stacked signal line and the stacked ground lines. A first conductive layer 400 includes a first conductive segment 402 of a conductive stacked signal line or a stacked ground line. A second conductive layer 404 includes a second conductive segment 406 of the conductive stacked signal line or the stacked ground line. Formed between the first and the second conductive layers 400, 404 is a via layer 408. A via 410 in the via layer 408 is formed between the first and the second conductive segments 402, 406. The via 410 contacts the first and the second conductive segments 402, 406 to electrically connect the second conductive segment 406 to the first conductive segment 402. As described previously, the conductive segments in a conductive stacked signal line or a stacked ground line are interlaced with vias, and collectively the conductive segments and the vias form the conductive stacked signal line or the stacked ground line.

Figure 5:
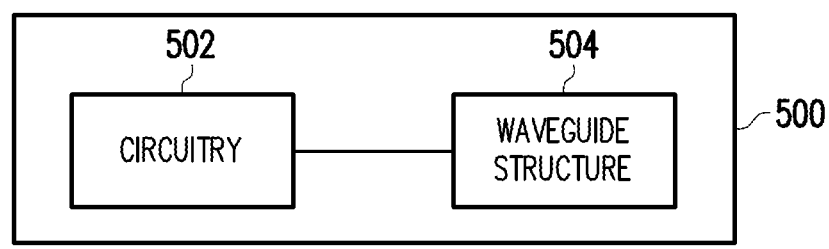
FIG. 5 illustrates a block diagram of an integrated circuit in accordance with some embodiments.

FIG. 5 illustrates a block diagram of an integrated circuit in accordance with some embodiments. The integrated circuit 500 includes circuitry 502 operably connected to one or more coplanar waveguide structures (represented by coplanar waveguide structure 504). The circuitry 502 includes one or more circuits that are configured to transmit and/or receive signals using the coplanar waveguide structure 504. The coplanar waveguide structure 504 can be implemented as one of the coplanar waveguide structures shown in FIGS. 1-3. As described earlier, the integrated circuit may be a MIC, a MMIC, or other integrated circuit or electrical component that transmits and/or receives at least millimeter wave signals. In some instances, the circuitry 502 can be positioned in a first integrated circuit or electrical component and the coplanar waveguide structure 504 may be located in a separate second integrated circuit or electrical component.

Figure 6A:
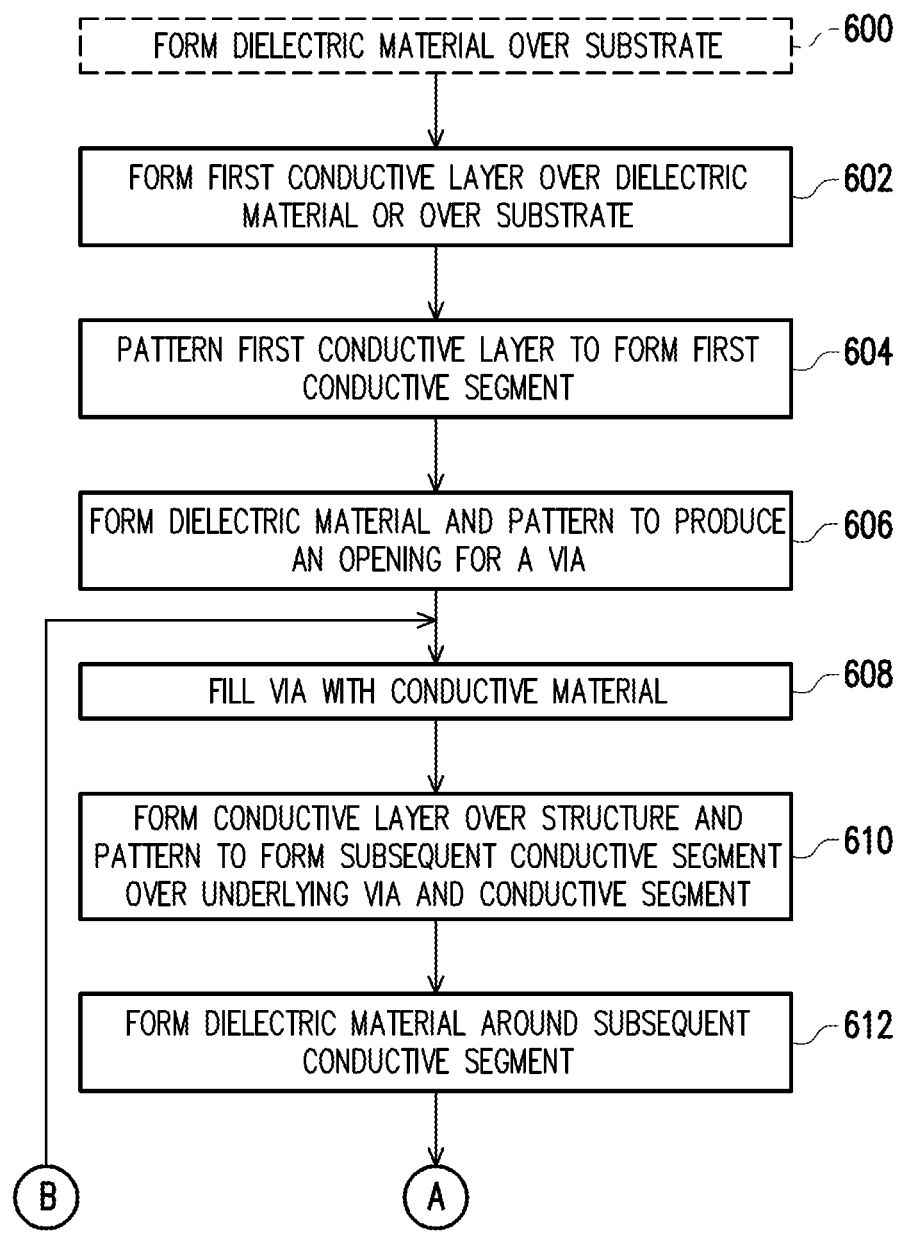
FIGS. 6A-6B depict a flowchart of an example method of fabricating the stacked signal lines and the stacked ground lines in accordance with some embodiments.
Figure 6B:
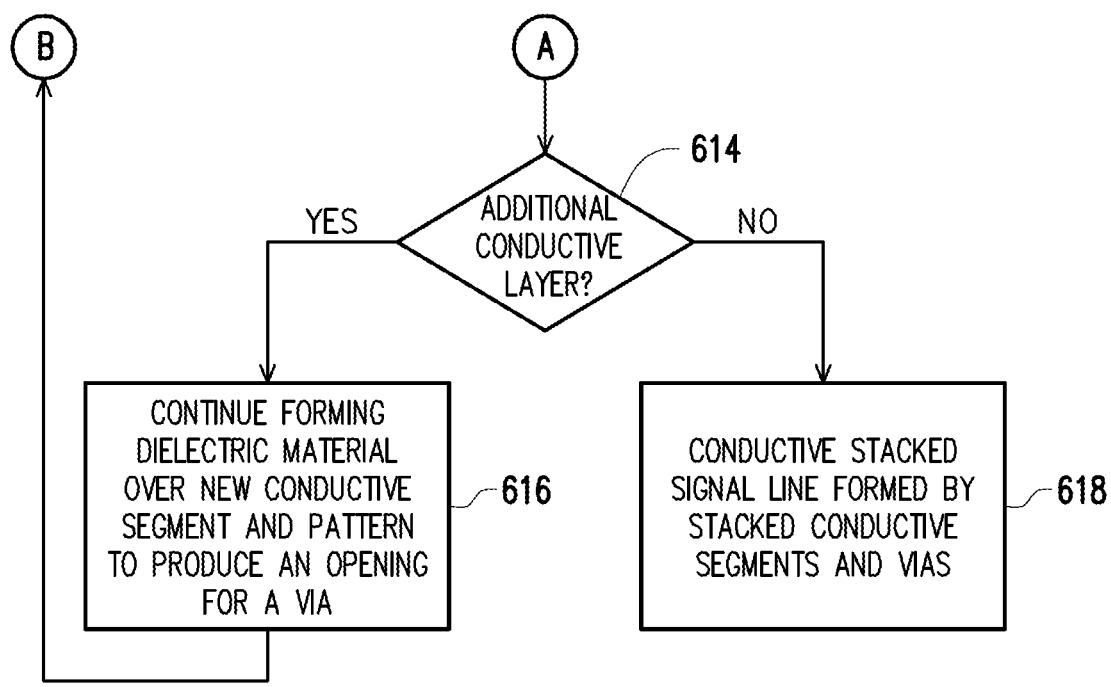

FIGS. 6A-6B depicts a flowchart of an example method of fabricating the conductive stacked signal lines and the stacked ground lines in accordance with some embodiments. The process is described in conjunction with forming a single conductive stacked signal line. The fabrication of additional conductive stacked signal lines and the stacked ground lines can be performed at the same time.

Initially, a dielectric material may be formed over a substrate in the optional block 600. This dielectric material can form the portion 302 of the dielectric layer 214 shown in FIG. 3. At block 602, a first conductive layer is formed over the dielectric material (when block 600 is performed) or over the substrate. For example, a conductive material can be deposited over the dielectric material or the substrate. One example of a conductive material is a metal.

The first conductive layer is patterned to produce a first conductive segment (block 604). Any suitable technique can be used to pattern the first conductive layer. For example, a mask may be formed over the conductive layer and used to define the location (e.g., an opening in the mask) of the first conductive segment. The conductive material is then formed (e.g., deposited) into the opening to produce the conductive segment.

Next, as shown in block 606, a dielectric material is formed over the structure and patterned to produce an opening in the dielectric material for a via to be formed on the first conductive segment. Again, any suitable technique can be used to form the via in the dielectric material. For example, a mask may be formed over the dielectric layer and used to define the location (e.g., opening) of the via. The via is then filled with a conductive material (block 608) and the surface of the structure is planarized (e.g., using chemical mechanical planarization). One example technique to fill the via with conductive material is to deposit the conductive material into the via.

Next, a subsequent conductive layer is formed (e.g., deposited) and patterned to produce a new conductive segment on the underlying via and over the underlying conductive segment (block 610). The new conductive segment is electrically connected to the underlying conductive segment through the via. A dielectric material is then formed around the new conductive segment to electrically isolate the conductive segment (block 612).

A determination is made at block 614 as to whether an additional conductive layer is to be formed in the coplanar waveguide structure. If so, the formation of the dielectric material continues such that the dielectric material is formed over the new conductive segment, and the dielectric material is patterned to produce an opening for a via to be formed on the new conductive segment (block 616). The method then returns to block 608 and the process repeats until all of the conductive layers and vias that form the conductive stacked signal line have been formed. When a determination is made at block 614 that an additional conductive layer will not be formed, the process passes to block 618 where the conductive stacked signal line is formed by the stacked conductive segments and the interlaced stacked vias.

Figure 7:
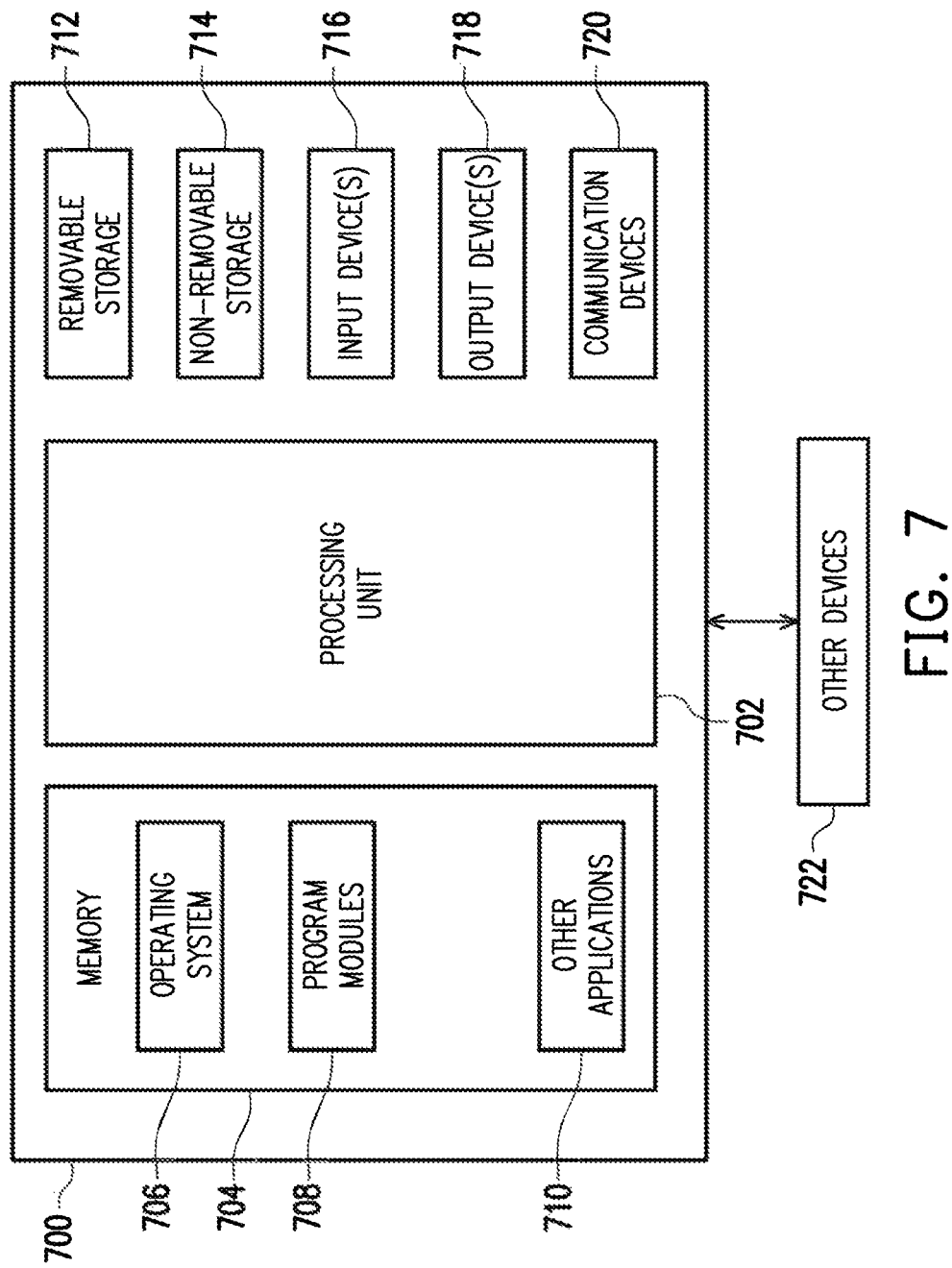
FIG. 7 illustrates a block diagram of an electronic device in which aspects of the disclosure may be practiced in accordance with some embodiments.

FIG. 7 depicts a block diagram of an electronic device with which aspects of the disclosure may be practiced in accordance with some embodiments. In a basic configuration, the electronic device 700 may include at least one processing unit 702 and at least one system memory 704. Depending on the configuration and type of the electronic device, the system memory 704 may comprise, but is not limited to, volatile storage (e.g., random access memory), non-volatile storage (e.g., read-only memory), flash memory, or any combination of such memories. The system memory 704 may include a number of program modules and data files, such as an operating system 706 for controlling the operation of the electronic device 700, one or more program modules 708 suitable for parsing received input, determining subject matter of received input, determining actions associated with the input and so on, and one or more other applications 710, including one or more electronic communication programs that enable the electronic device 700 to communicate with other electronic devices. Example electronic communication programs include, but are not limited to, a cellular communications application, an infrared (IR) communication application, a radio frequency (RF) application, a near-field communication (NFC) application, and/or a satellite communication application.

The electronic device 700 may have additional features or functionality. For example, the electronic device 700 may also include additional data storage devices (removable and/or non-removable) such as, for example, magnetic disks, optical disks, or tape. Such additional storage is illustrated in FIG. 7 by a removable storage device 712 and a non-removable storage device 714.

The electronic device 700 may also have one or more input device(s) 716 such as a keyboard, a trackpad, a mouse, a pen, a sound or voice input device, a touch, force and/or swipe input device, etc. The output device(s) 718 such as a display, speakers, a printer, etc. may also be included. The aforementioned devices are examples and others may be used. The electronic device 700 may include one or more communication devices 720 allowing communications with other electronic devices 722. Examples of suitable communication devices 720 include, but are not limited to, cellular, IR, NFC, RF, and/or satellite transmitter, receiver, and/or transceiver circuitry, universal serial bus (USB), parallel, and/or serial ports.

The term computer-readable media as used herein may include computer storage media. Computer storage media may include volatile and nonvolatile, removable and non-removable media implemented in any method or technology for storage of information, such as computer readable instructions, data structures, or program modules.

The system memory 704, the removable storage device 712, and the non-removable storage device 714 are all computer storage media examples (e.g., memory storage or storage device). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the electronic device 700. Any such computer storage media may be part of the electronic device 700. Computer storage media does not include a carrier wave or other propagated or modulated data signal.

The components described in conjunction with the electronic device 700 may be suitable for any electronic device that includes one or more coplanar waveguide structures.

Figure 8:
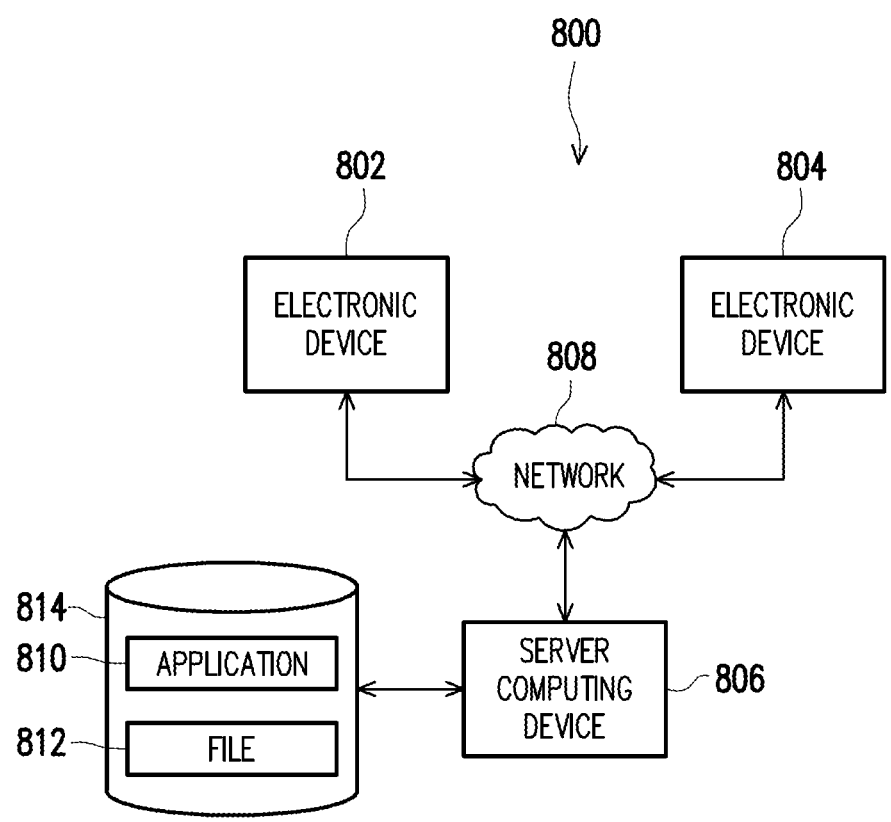
FIG. 8 depicts an example system in which aspects of the disclosure may be practiced in accordance with some embodiments.

FIG. 8 is a block diagram illustrating a system in which aspects of the disclosure may be practiced in accordance with some embodiments. The system 800 allows a first electronic device 802 to communicate with a second electronic device 804. The first and the second electronic devices 802, 804 can each transmit and receive signals of various frequencies, including millimeter wave signals. In some embodiments, the first and the second electronic devices 802, 804 may each be a cellular phone, a tablet computing device, or a mobile computing device. The first and the second electronic devices 802, 804 can each include the components, or be connected to the components, that are shown associated with the electronic device 700 in FIG. 7.

The first and the second electronic devices 802, 804 are each configured to access or communicate with one or more server computing devices (represented by server computing device 806) using one or more networks (represented by network 808). Such access or communications can be performed using at least coplanar waveguide structures. The server computing device 806 can access or execute one or more applications (represented by application 810) and/or one or more files (represented by file 812) stored in one or more storage devices (represented by storage device 814). The server computing device can include the components, or be connected to the components, that are shown associated with the electronic device 700 in FIG. 7.

In one aspect, a coplanar waveguide structure includes a dielectric layer disposed over at least a portion of a high resistivity substrate and a planar transmission line disposed within the dielectric layer. In some instances, the planar transmission line can include a conductive signal line and one or more ground lines disposed within the dielectric layer. In other instances, the planar transmission line may include a conductive stacked signal line and one or more stacked ground lines disposed within the dielectric layer.

In another aspect, an integrated circuit includes circuitry operably connected to a coplanar waveguide structure. The circuitry includes one or more circuits configured to transmit and/or receive signals using the coplanar waveguide structure. The coplanar waveguide structure includes a dielectric layer disposed a high resistivity substrate and a planar transmission line disposed within the dielectric layer. In some instances, the planar transmission line can include a conductive signal line and one or more ground lines disposed within the dielectric layer. In other instances, the planar transmission line may include a conductive stacked signal line and one or more stacked ground lines disposed within the dielectric layer.

In yet another aspect, a method for fabricating a stacked signal line and stacked ground lines for a planar transmission line can include depositing a first conductive layer over a high resistivity substrate and patterning the conductive layer to form a first conductive segment for the stacked signal line and second conductive segments for the stacked ground lines. A dielectric layer is formed over the first and the second conductive segments and patterned to form a first opening in the dielectric material for a first via to be formed on the first conductive segment and to form second openings for second vias to be formed on the second conductive segments. The first and the second vias are filled with a conductive material. Another conductive layer is deposited and patterned to stack a third conductive segment on the first via and over the first conductive segment and to stack fourth conductive segments on the second vias and over the second conductive segments. The first conductive segment, the first via, and the third conductive segment form the stacked signal line and the second conductive segments, the second vias, and the fourth conductive segments form the stacked ground lines.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A coplanar waveguide structure, comprising:
a high resistivity substrate;
a dielectric layer disposed over at least a portion of the high resistivity substrate; and
a planar transmission line disposed within the dielectric layer, the planar transmission line comprising:
a conductive stacked signal line;
a first stacked ground line positioned on a first side of the conductive stacked signal line and separated from the conductive stacked signal line by a first distance; and
a second stacked ground line positioned on a second side of the conductive stacked signal line and separated from the conductive stacked signal line by a second distance,
wherein:
the conductive stacked signal line, the first stacked ground line, and the second stacked ground line each comprises a plurality of conductive segments in a plurality of conductive layers stacked vertically and electrically connected to one another with vias in via layers;
the conductive layers include conductive layers $C_1$ through $C_N$ and the via layers include via layers $V_1$ through $V_M$, where N is a number greater than one, M is a number equal to or greater than one, and M is less than N
a first bottom conductive segment of the conductive stacked signal line, a second bottom conductive segment of the first stacked ground line, and a third bottom conductive segment of the second stacked ground line are formed in the first conductive layer $C_1$ that is directly on a top surface of the high resistivity substrate;

a first top conductive segment of the conductive stacked signal line, a second top conductive segment of the first stacked ground line, and a third top conductive segment of the second stacked ground line are formed in the Nth conductive layer CN that is immediately below a top conductive layer the top conductive layer is an ultra-thick metal layer having a thickness of one to fifty micrometers and is not used for the conductive stacked signal line, the first stacked ground line, and the second stacked ground line; and a first width of the conductive stacked signal line, a second width of the first stacked ground line, and a third width of the second stacked ground line are based at least in part on a number of conductive layers formed underneath the ultra-thick metal layer.

2. The coplanar waveguide structure of claim 1, wherein the high resistivity substrate comprises a high resistivity silicon substrate.

3. The coplanar waveguide structure of claim 1, wherein the first width of the conductive stacked signal line substantially equals the second and third widths of the first and the second stacked ground lines.

4. The coplanar waveguide structure of claim 1, wherein the plurality of conductive segments in the conductive stacked signal line and in the first and the second stacked ground lines are interlaced with vias.

5. The coplanar waveguide structure of claim 1, wherein the first distance substantially equals the second distance.

6. The coplanar waveguide structure of claim 1, wherein the plurality of conductive segments in the conductive stacked signal line and in the first and the second stacked ground lines are formed of copper, silver, or aluminum.

7. The coplanar waveguide structure of claim 1, wherein the coplanar waveguide structure is operable to transmit or receive at least millimeter wave signals.

8. The coplanar waveguide structure of claim 1, wherein the first width of the conductive stacked signal line is different than the second and third widths of the first and the second stacked ground lines.

9. The coplanar waveguide structure of claim 1, wherein the first distance is different than the second distance.

10. An integrated circuit, comprising:
circuitry comprising one or more circuits; and
a coplanar waveguide structure operably connected to the circuitry, the coplanar waveguide structure comprising:
a high resistivity substrate;
a dielectric layer disposed over at least a portion of the high resistivity substrate; and
a planar transmission line disposed within the dielectric layer, wherein the planar transmission line comprises:
a conductive stacked signal line;
a first stacked ground line positioned on a first side of the conductive stacked signal line and separated from the conductive stacked signal line by a first distance; and
a second stacked ground line positioned on a second side of the conductive stacked signal line and separated from the conductive stacked signal line by a second distance,
wherein:
the first distance differs from the second distance;
the conductive stacked signal line, the first stacked ground line, and the second stacked ground line each comprises a plurality of conductive segments in a plurality of conductive layers stacked vertically and electrically connected to one another with vias in via layers;
the conductive layers include conductive layers $C_1$ through $C_N$ and the via layers include via layers $V_1$ through $V_M$, where N is a number greater than one, M is a number equal to or greater than one, and M is less than N
a first bottom conductive segment of the conductive stacked signal line, a second bottom conductive segment of the first stacked ground line, and a third bottom conductive segment of the second stacked ground line are formed in the first conductive layer $C_1$ that is directly on a top surface of the high resistivity substrate;
a first top conductive segment of the conductive stacked signal line, a second top conductive segment of the first stacked ground line, and a third top conductive segment of the second stacked ground line are formed in the Nth conductive layer CN that is immediately below a top conductive layer
the top conductive layer is an ultra-thick metal layer and is not used for the conductive stacked signal line, the first stacked ground line, and the second stacked ground line; and
a first width of the conductive stacked signal line, a second width of the first stacked ground line, and a third width of the second stacked ground line are based at least in part on a number of conductive layers formed underneath the ultra-thick metal layer.

11. The integrated circuit of claim 10, wherein the integrated circuit comprises a monolithic microwave integrated circuit.

12. The integrated circuit of claim 10, wherein the first width of the conductive stacked signal line substantially equals the second and the third widths of the first and the second stacked ground lines.

13. The integrated circuit of claim 10, wherein the plurality of conductive segments in the conductive stacked signal line and in the first and the second stacked ground lines are interlaced with vias.

14. The integrated circuit of claim 10, wherein the plurality of conductive segments in the conductive stacked signal line and in the first and the second stacked ground lines are formed of copper, silver, or aluminum.

15. The integrated circuit of claim 10, wherein the integrated circuit comprises a microwave integrated circuit.

16. The integrated circuit of claim 10, wherein the first width of the conductive stacked signal line, the second width of the first stacked ground line, and the third width of the second stacked ground line are further based at least in part on which conductive layers in the integrated circuit form the conductive stacked signal line and the first and the second stacked ground lines.

17. The integrated circuit of claim 10, wherein the ultra-thick metal layer has a thickness of one to fifty micrometers.

18. The integrated circuit of claim 10, wherein the first width of the conductive stacked signal line is different than the second and the third widths of the first and the second stacked ground lines.

19. A method for fabricating a stacked signal line and stacked ground lines for a planar transmission line, the method comprising:
- determining a first width of the conductive stacked signal line based at least in part on a number of conductive layers to be used to form the conductive stacked signal line and stacked ground lines;
- determining a second width of the stacked ground lines based at least in part on the number of conductive layers to be used to form the conductive stacked signal line and stacked ground lines;
- forming a first conductive layer directly on a substrate;
- patterning the first conductive layer to form a first conductive segment for the stacked signal line and second conductive segments for the stacked ground lines;
- forming a dielectric material over and between the first and the second conductive segments;
- forming a first opening in the dielectric material for a first via to be formed on the first conductive segment and second openings for second vias to be formed on the second conductive segments;
- filling the first and the second openings with a conductive material;
- forming and patterning a second conductive layer to stack a third conductive segment on the first via and over the first conductive segment and to stack fourth conductive segments on the second vias and over the second conductive segments; and wherein:
- the first conductive segment, the first via, and the third conductive segment form the stacked signal line;
- the second conductive segments, the second vias, and the fourth conductive segments form the stacked ground lines;
- the first stacked ground line is separated from the conductive stacked signal line by a first distance;
- the second stacked ground line is separated from the conductive stacked signal line by a second distance;
- the first distance differs from the second distance; and
- forming a top conductive layer that is an ultra-thick metal layer having a thickness of one to fifty micrometers immediately above the second conductive layer, wherein the top conductive layer is not used for the conductive stacked signal line or the stacked ground lines.

20. The method of claim 19, wherein the substrate comprises a high resistivity substrate.

* * * * *